United States Patent
Fujita et al.

(10) Patent No.: US 10,090,816 B2
(45) Date of Patent: Oct. 2, 2018

(54) CURRENT REUSE AMPLIFIER

(71) Applicant: Sumitomo Electric Industries, Ltd., Osaka (JP)

(72) Inventors: Seiji Fujita, Yokohama (JP); Tsuneo Tokumitsu, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/473,023

(22) Filed: Mar. 29, 2017

(65) Prior Publication Data

US 2017/0288623 A1 Oct. 5, 2017

(30) Foreign Application Priority Data

Mar. 30, 2016 (JP) .................. 2016-069460

(51) Int. Cl.
*H03F 3/60* (2006.01)
*H03F 3/193* (2006.01)
*H03F 1/02* (2006.01)

(52) U.S. Cl.
CPC ............ *H03F 3/601* (2013.01); *H03F 3/193* (2013.01); *H03F 2200/411* (2013.01); *H03F 2200/451* (2013.01)

(58) Field of Classification Search
USPC ...... 330/124 R, 295, 286, 310, 98, 133, 150
See application file for complete search history.

(56) References Cited

U.S. PATENT DOCUMENTS 6,900,696 B2 * 5/2005 Lautzenhiser .......... H03F 1/301
330/286
2008/0078764 A1 4/2008 McEldowney et al.

FOREIGN PATENT DOCUMENTS

JP 2008-035083 A 2/2008
JP 2015-019328 A 1/2015

* cited by examiner

*Primary Examiner* — Hieu Nguyen
(74) *Attorney, Agent, or Firm* — Venable LLP; Michael A. Sartori; Laura G. Remus

(57) ABSTRACT

A two-stage amplifier of a type of the current re-use configuration is disclosed. The amplifier includes first to third transistors, where the first transistor constitute the first stage, while, the latter two transistors constitute the second stance. The first to third transistors are connected in series between a power supply and ground such that a bias current supplied to the third transistor flows in the second and first transistors. The first transistor in the source thereof is grounded in the DC mode. The second transistor is grounded in the AC mode but floated in the DC mode. The third transistor that outputs an amplified signal is connected in parallel in the AC mode but in series in the DC mode with respect to the second transistor.

13 Claims, 10 Drawing Sheets

CURRENT REUSE AMPLIFIER

BACKGROUND OF THE INVENTION

1. Field of the Invention

The present invention relates to an amplifier for amplifying a radio frequency (RF) signal, in particular, the invention relates an amplifier with a type of the current re-use configuration.

2. Related Prior Art

A type of an RF amplifier called as the current re-use configuration has been known and has been disclosed in a Japanese Patent Application laid open No. JP-2008-035083A, where the current re-use configuration supplies a bias current for the downstream stage commonly to the upstream stage through the downstream stage. Because the amplifying stages in the current re-use configuration are connected in series between the power supply and the ground in the DC mode, such an amplifier may save the bias current. Recent communication system such as a base station for mobile phones requests an amplifier implemented therein to generate greater and greater output power. However, the current re-use configuration is hard to increase the output power because the bias current in the downstream stage fully flows within the upstream stage.

SUMMARY OF INVENTION

One aspect of the present invention relates to an amplifier that includes an upstream stage, a downstream stage, and an intermediate node between the upstream stage and the downstream stage. The amplifier provides a first transistor in the upstream stage, and second and third transistors and a distributed transmission line in the downstream stage. The first transistor includes a control terminal and two current terminals, where the control terminal receives an input signal, one of the two current terminals is grounded, and another of the two current terminals is connected to the intermediate node. The second transistor provides a control terminal and two current terminals, where the control terminal is coupled with the intermediate node, while, one of the two current terminals is grounded in the AC mode but floated in the DC mode. The third transistor provides a control terminal and two current terminals, where the control terminal is coupled with the intermediate node, while, one of the two current terminals is coupled with the another of the two current terminals of the second transistor through the distributed transmission line and another of the two current terminals of the third transistor outputs an output signal.

Another aspect of the present invention relates also to an amplifier of a type of a current re-use configuration. The amplifier includes an upstream stage, a downstream stage and a power supply. The upstream stage, which is grounded in a direct current (DC) mode and an alternating current (AC) mode, receives an input signal and outputs an amplified signal. The downstream stage, which is grounded in the AC mode but floated in the DC mode, receives the amplified signal and outputs an output signal. The power supply provides a bias current directly to the downstream stage but indirectly to the upstream stage through the downstream stage. A feature of the amplifier of the invention is that the downstream stage includes two transistors and a distributed transmission line between the two transistors. One of the two transistors is connected to the power supply and another of the two transistors is connected to the upstream stage. The two transistors commonly receive the amplified signal output from the upstream stage. The transmission line provided between the two transistors may adjust voltage gains of the two transistors substantially equal to each other and set phase difference from the amplified signal to the output signal between the two transistors substantially equal to each other.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, an embodiment of the present invention will be described as referring to accompanying drawings. In the description of the drawings, numerals or symbols same with or similar to each other will refer to elements same with or similar to each other without duplicating explanations.

Figure 1:
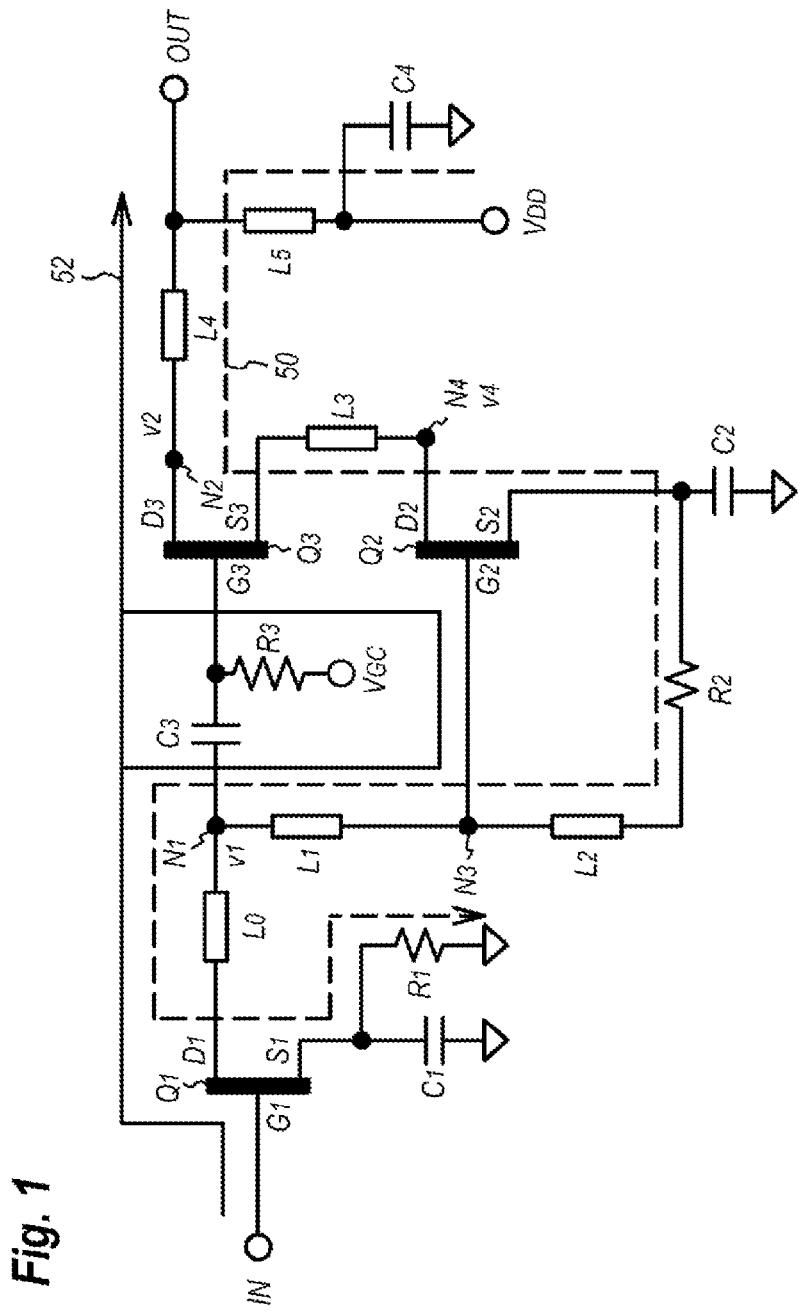
FIG. 1 shows a circuit diagram of an amplifier according to embodiment of the present invention.

FIG. 1 shows a circuit diagram of an amplifier according to the first embodiment of the present invention. The amplifier shown in FIG. 1 provides transistors, exactly filed effect transistors (FETs), $Q_1$ to $Q_3$. The first transistor $Q_1$ in a source $S_1$ thereof is grounded through a parallel circuit of a resistor $R_1$ and a capacitor $C_1$, where the capacitor $C_1$ grounds the source $S_1$ in the AC mode. The gate $G_1$ of the first transistor $Q_1$ receives an input signal having frequency components in a radio frequency (RF) range from an input terminal IN. The drain $D_1$ is connected to a node $N_1$ through a transmission line $L_0$, exactly, a distributed transmission line $L_0$ both in the AC mode and in the DC mode. The explanation below assumes that a context of "in the AC mode" means that two nodes coupled to each other are physically isolated but may be regarded to be a short-circuit for a frequency subject to the amplifier, and another context of "in the DC mode" means that two nodes are physically connected, which also means that the two nodes may be regarded to be the short circuit at frequencies far lower than the frequency subject to the amplifier.

For the second transistor $Q_2$, the source $S_2$, which is the first current terminal of a transistor, is grounded through a capacitor $C_2$ in the AC mode but floated in the DC mode. The source $S_2$ is also coupled to the node $N_3$ through a series circuit of a distributed transmission line $L_2$ and a resistor $R_2$ in the DC mode, while, the node $N_3$ is connected to the first node $N_1$ through a distributed transmission line $L_1$ in the DC mode. The gate $G_2$ is directly coupled to the third node $N_3$ in both of the AC and the DC modes. The drain $D_2$ is also directly coupled to the fourth node $N_4$ in both of the AC and the DC modes.

For the third transistor $Q_3$, the source $S_3$ thereof is connected to the fourth node $N_4$ through the distributed transmission line $L_3$. The gate $G_3$, which may be called as the control terminal, is coupled with the first node $N_1$ through a capacitor $C_3$, which means that the gate $G_3$ is connected to the first node $N_1$ in the AC mode but isolated therefrom in the DC mode. The gate $G_3$ receives a gate bias $V_{GC}$ through a register $R_3$. The drain $D_3$ thereof, which may be called as the second current terminal of a transistor, is directly connected to the second node $N_2$ and coupled with the output terminal OUT through a distributed transmission line $L_4$, where the output terminal OUT outputs an amplified signal. The output terminal OUT receives a drain bias $V_{DD}$ through a distributed transmission line $L_5$. One of the terminals of the distributed transmission line $L_5$ is bypassed through a capacitor $C_4$, that is, the capacitor $C_4$ is, what is called as a bypassing capacitor that may bypass high frequency components contained in the amplified signal output from the output terminal OUT to the ground. Thus, high frequency components are suppressed from leaking into the drain bias $V_{DD}$. In the circuit shown in FIG. 1, the distributed transmission lines, $L_0$ to $L_4$, are provided for matching or adjusting impedance viewed at the nodes. The distributed transmission lines, $L_0$ to $L_5$, are replaceable with inductors.

The capacitors, $C_1$ and $C_2$, have enough capacitance to ground the sources, $S_1$ and $S_2$, in the AC mode but forces the sources, $S_1$ and $S_2$, to be floated in the DC mode. The signal amplified by the first transistor $Q_1$ is split at the first node $N_1$, one of which enters the gate $G_2$ of the second transistor $Q_2$ through the distributed transmission line $L_1$; while, the other reaches the gate $G_3$ of the third transistor $Q_3$ through the capacitor $C_3$. The gate biases of the first and the second transistors, $Q_1$ and $Q_2$, namely, gate voltages measured from the respective source voltages may be determined by a current flowing in the resistors, $R_1$ and $R_2$, and resistance thereof. The gate bias of the third transistor $Q_3$ may be determined by the gate bias $V_{GC}$ supplied through the resistor $R_3$ and the drain bias of the second transistor $Q_2$, namely, a drain voltage thereof measured from the source voltage of the second transistor $Q_2$.

The amplifier of the first embodiment has the circuit diagram above described. Three transistors, $Q_1$ and $Q_3$, are connected in series between the drain bias $V_{DD}$ and the ground in the DC mode. That is, the bias current supplying from the drain bias $V_{DD}$ flows in the third transistor $Q_3$ and the second transistor $Q_2$ from the respective drains, $D_3$ and $D_2$, to the sources, $S_3$ and $S_2$, and through the distributed transmission line $L_3$, then, streams into the first transistor $Q_1$ through the distributed transmission lines, $L_0$ to $L_3$. The current stream in the DC mode is denoted by a broken line 50 in FIG. 1. On the other hand, the first and second transistors, $Q_1$ and $Q_2$, in the sources, $S_1$ and $S_2$, thereof are grounded in the AC mode; but the transistors, $Q_2$ and $Q_3$, connected in series in the DC mode but in parallel in the AC mode so as to commonly receive the RF signal amplified by the first transistor $Q_1$ from the first node $N_1$. Also, the outputs of the second and third transistors, $Q_2$ and $Q_3$, are superposed at the second node $N_2$. Thus, the RF signal entering the input terminal IN is amplified by the two-stage arrangement of the three transistors, $Q_1$ and $Q_3$, along the solid line 52 in the AC mode.

Thus, three transistors, $Q_1$ to $Q_3$, may commonly provide the bias current supplied from the drain bias $V_{DD}$, which is sometimes called as the current re-use, which may save the power consumption of the amplifier. While, the second amplifying stage of the amplifier provides two transistors, $Q_2$ and $Q_3$, connected in series in the DC mode but in parallel in the AC mode, the amplifier of FIG. 1 may increase the output power thereof.

Next, preferable characteristics of the distributed transmission lines, $L_2$ and $L_3$, are estimated using respective values exemplarily listed below:

Distributed transmission liens, $L_0$ to $L_5$, have electrical lengths $\theta$ and physical lengths l of, $\theta_0$=0.5 radian, $\theta_1$=0.2 radian, $\theta_2$=4 $\theta$, $\theta_3$=3 $\theta$, $l_4$=650 µm, $l_5$=700 µm, where radian corresponds to a wavelength $\lambda g$ of an RF signal subject to the amplifier, namely $\lambda g$=2 $\pi$ radian, which is assumed to be 20 GHz in the present embodiment, and $\theta$ is adjusted from 0 to 1.5 radian in the embodiment;

Two distributed transmission lines, $L_4$ and $L_5$, have physical widths, $w_4$ and $w_5$, of $w_4$=30 µm and $w_5$=30 µm;

Capacitors, $C_1$ to $C_4$, have capacitance of $C_1$=13.5 pF, $C_2$=7.2 pF, $C_3$=0.36 pF, and $C_4$=5.4 pF;

Resistors, $R_1$ to $R_3$, have resistance of $R_1$=2.5Ω, $R_2$=2.5Ω, and $R_3$=2.0 k Ω; and Biases, $V_{DD}$ and $V_{GC}$ are $V_{DD}$=7.5 V and $V_{GC}$=3.6 V, respectively.

The estimation further assumes that the transistors, $Q_1$ to $Q_3$, are a type of high electron mobility transistor (HEMT) having a channel layer made of InGaAs and a barrier layer made of AlGaAs, and have sizes substantially same with each other. The estimation below concentrates on the electrical lengths of the distributed transmission lines, $L_2$ and $L_3$, because these distributed transmission lines, $L_2$ and $L_3$, may determine balance of two transistors, $Q_2$ and $Q_3$, connected in series in the DC mode but in parallel in the AC mode, which strongly affect a maximum output power of the amplifier.

Figure 2:
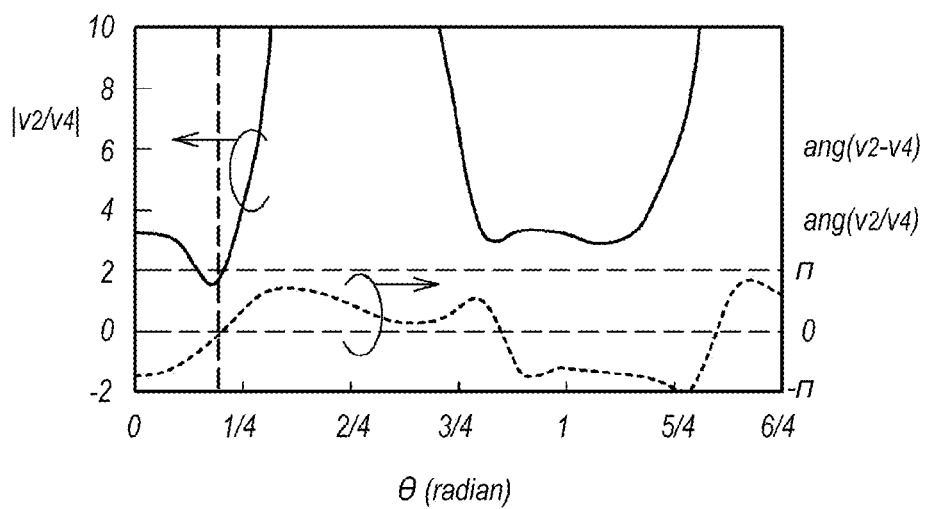
FIG. 2 shows behaviors of a ratio of the voltage gains of the second and third transistors, and a difference of phase delays between the second and third transistors against an electrical length of the distributed transmission line.

Responses of voltage signals in the AC mode at the nodes, $N_2$ and $N_4$, are calculated based on the small signal model of the transistors. FIG. 2 show a ratio $v_2/v_4$ of the voltage signals, which corresponds to an efficiency of the third transistor $Q_3$; and a phase difference ang($v_2/v_4$) between two voltage signals, $v_2$ and $v_4$, at the respective nodes, $N_2$ and $N_4$, as varying the electrical lengths of the second and third distributed transmission lines, $L_2$ and $L_3$, from 0 to 1.5 radian. As shown in FIG. 2, the phase difference ang($v_2/v_4$)

becomes zero (0) at θ=0.2 radian, at which the ratio $|v_2/v_4|$ becomes around 2. Although other electrical lengths longer than 0.2 radian set the phase difference $ang(v_2/v_4)$ to be zero, those electrical lengths inevitably result in longer physical lengths of the distributed transmission lines, $L_2$ and $L_3$. Accordingly, the shortest electrical length of 0.2 radian is practically preferable.

The phase difference $ang(v_2/v_4)$ of zero means that two signals, $v_2$ and $v_4$, show phases substantially matching to each other, which also means, when two transistors, $Q_2$ and $Q_3$, in the outputs thereof are combined, a loss due to the phase difference may be most effectively eliminated or suppressed. Also, when the ratio $|v2/v4|$ becomes two (2), two transistors, $Q_2$ and $Q_3$, have a drain-source bias substantially same to each other. That is, the drain-source voltage $v_4$ of the second transistor $Q_2$ and that $v_2$-$v_4$ of the third transistor $Q_3$ are equal to each other; the power P appearing in the second node $N_2$ becomes $P=2\times(v_4-v_2)\times i$, where i is an RF current; and two transistors, $Q_2$ and $Q_3$, show saturation performance same to each other when the input power entering the respective gates, $G_2$ and $G_3$, increase. On the other hand, when unbalanced states, that is, when the ratio becomes $v_2/v_4<<2$ or $v_2/v_4>>2$, one of transistors, $Q_2$ and $Q_3$, earlier shows the saturation, which restricts the maximum output power of the amplifier and degrades the efficiency.

Figure 3:
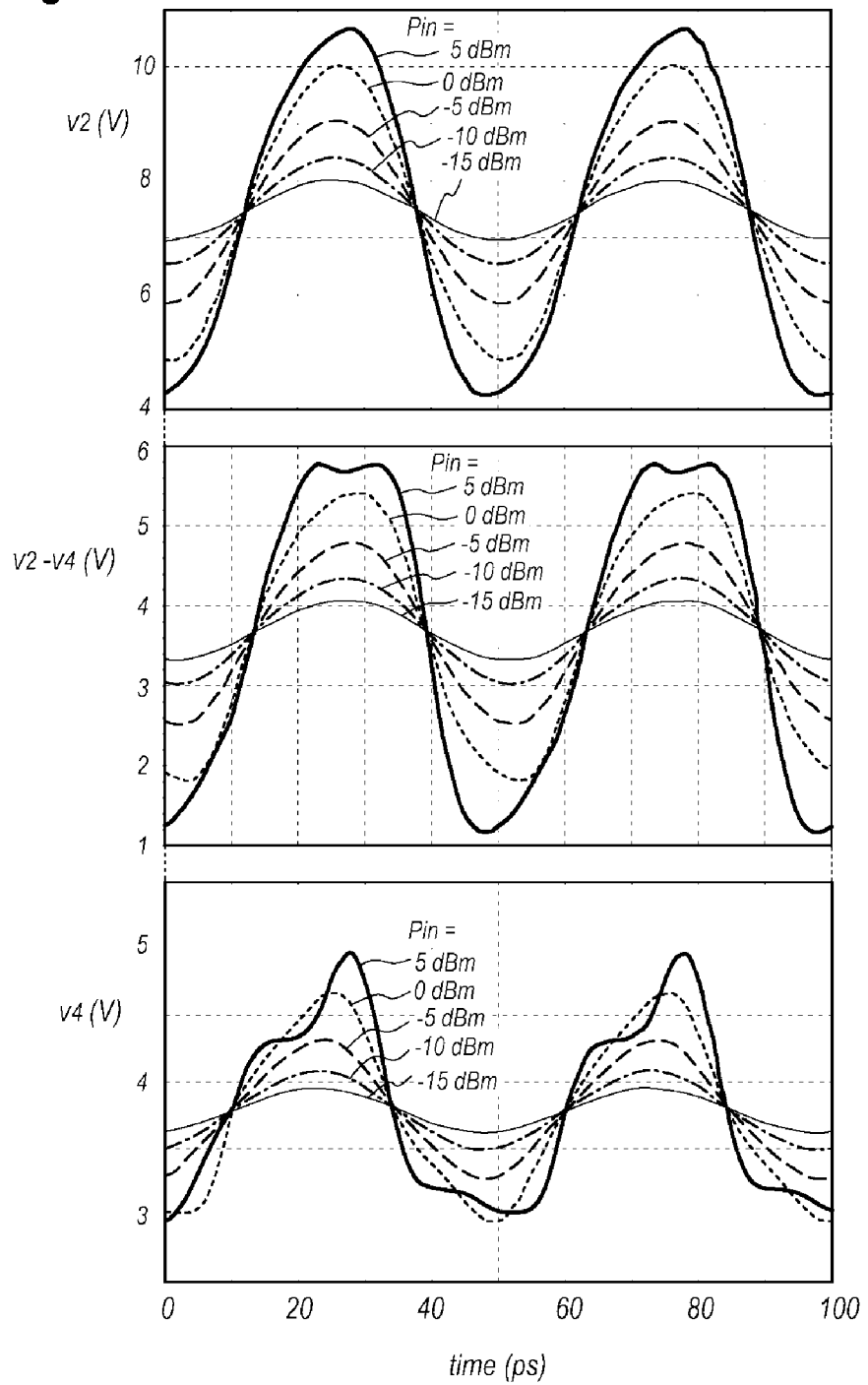
FIG. 3 shows waveforms of the outputs of the amplifier, the second transistor, and the third transistor, respectively, as varying power of the input signal in the amplifier of the present invention.

Assuming the electrical length θ=0.2 radian for the distributed transmission lines, $L_2$ and $L_3$, practical waveforms of the signals, $v_2$ and $v_4$, are evaluated using the large signal model for the transistors, $Q_2$ and $Q_3$. FIG. 3 shows the waveforms of the signals, v2, v2-v4, and v4, of the amplifier shown in FIG. 1 as increasing the input power PIN from −15 dBm to 5 dBm. The waveforms for the input power from −15 dBm to 0 dBm are triangular. However, voltage signals, v2-v4 and v4 for the input power of 5 dBm are deformed from triangles because the transistors, $Q_2$ and $Q_3$, operate in the saturation region. On the other hand, the waveform of the signal $v_2$ for the input power of 5 dBm remains in a triangle. This is because the two distributed transmission lines, $L_2$ and $L_3$, may set the phase difference to be zero and the ratio to be 2.

Figure 4:
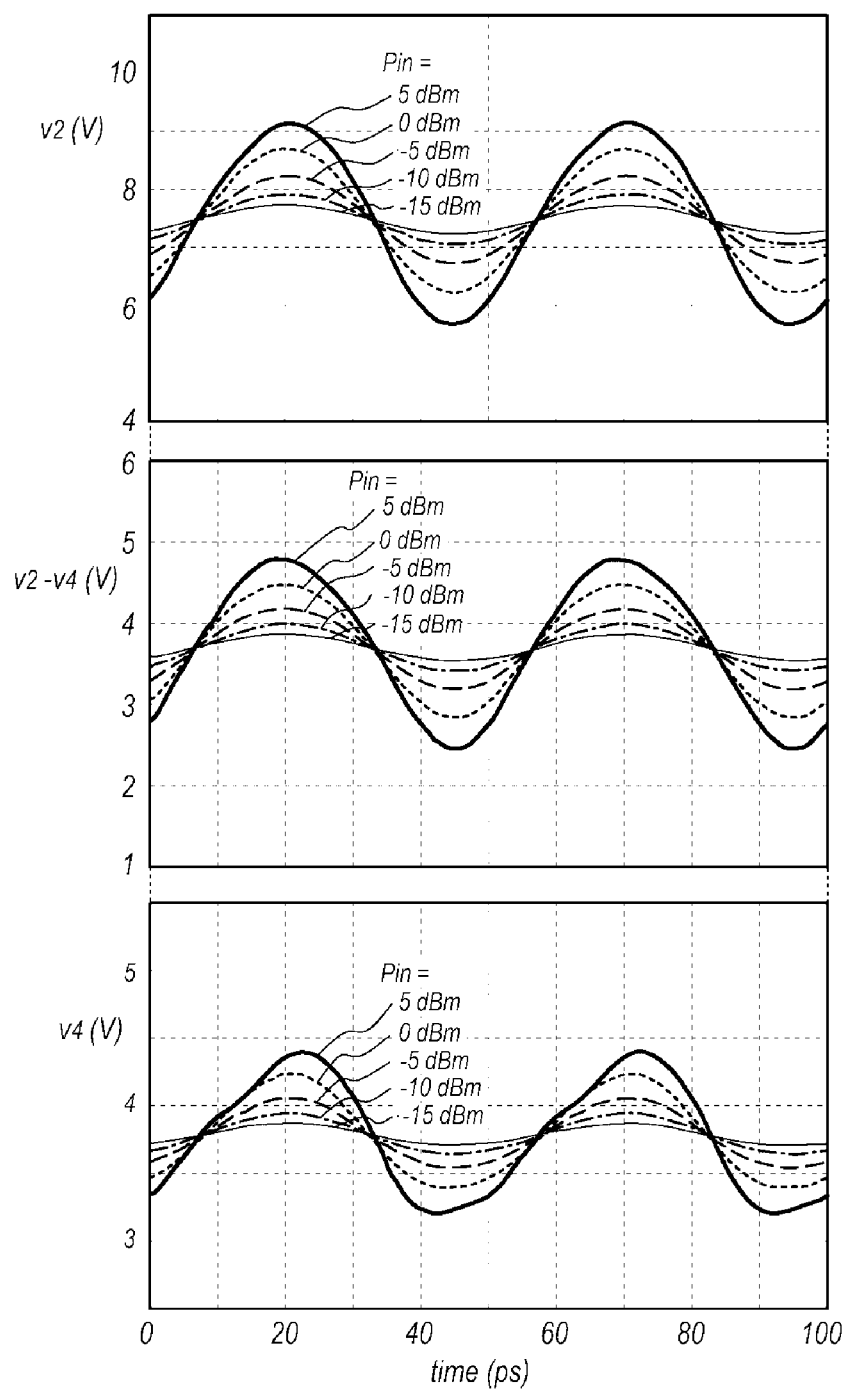
FIG. 4 shows waveforms of the outputs of the amplifier, the second transistor, and the third transistor, respectively, as varying power of the input signal for the circuit without the distributed transmission line between the second and third transistors according to an example comparable to the present invention.

FIG. 4 shows the waveforms of the signals, v2, v2-v4, and v4, for an amplifier without the distributed transmission line $L_3$ between two transistors, $Q_2$ and $Q_3$; that is, the source $S_3$ of the third transistor $Q_3$ is directly connected to the drain $D_2$ of the second transistor $Q_2$. As shown in FIG. 4, the signals, v2, v2-v4, and v4, for the input power of −15 dBm to 5 dBm show triangular waveforms, which means that two transistors, $Q_2$ and $Q_3$, operate in the non-saturated region, namely, in the linear region, even the input power becomes 5 dBm; but, the amplitude of the signal v2 becomes smaller compared with the amplitude obtained by the amplifier with the distributed transmission line $L_3$. When two transistors, $Q_2$ and $Q_3$, in the comparable amplifier corresponding to FIG. 4 operate in the saturation region, the waveform of the signal v2 becomes considerably distorted.

Figure 5:
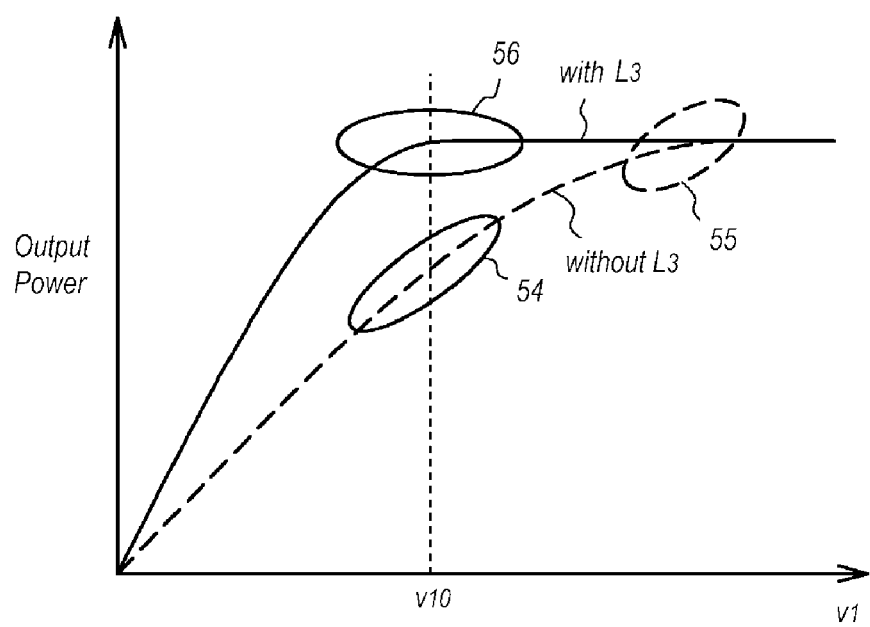
FIG. 5 schematically explains the operation of the second and third transistors in the circuit of the invention and that in the comparable example for the output power P against the input signal with an amplitude v1.

FIG. 5 schematically explains a relation of the output power against a signal v1 at the node $N_1$, where the signal v1 corresponds to the input power PIN. The amplifier without the distributed transmission line $L_3$ operates in a region 54, which is the linear region, at the RF signal v10 corresponding to the input power of 5 dBm. Accordingly, the signal, v2, v2-v4, and v4, show undistorted waveforms as shown in FIG. 4. When the amplifier without the distributed transmission line $L_3$ operates in the saturated region 55 in FIG. 5, the RF signals, v2 and v2-v4, show considerably distorted waveforms to secure the available output power.

Accordingly, such an amplifier without the distributed transmission line $L_3$ is inevitably set in the operating point of the transistors, $Q_2$ and $Q_3$, to be within the linear region 54.

On the other hand, the amplifier with the distributed transmission line $L_3$ operates the two transistors, $Q_2$ and $Q_3$, in the region 56 where the output power of the amplifier saturates for the input voltage v10 corresponding to the input power of 5 dBm; the voltages, $v_2$-$v_4$ and $v_4$, to which the second transistor $Q_2$ concerns, are distorted as shown in FIG. 3. However, the voltage v4 shows an un-distorted waveform due to the compensation of the third transistor $Q_3$ described above and the amplifier may enhance the output power P.

Thus, the amplifier of the embodiment may have two transistors in the second stage of the current re-use configuration to enhance the output power thereof because the distributed transmission line $L_3$ may compensate the phases of the drain output of the two transistors, $Q_2$ and $Q_3$, connected in parallel in the AC mode but in series in the DC mode. The distributed transmission line $L_3$ has an electrical length making the signal v2 of the drain $D_2$ of the second transistor $Q_2$ in the phase thereof matching with the phase of the signal v4 of the drain $D_3$ of the third transistor $Q_3$. Thus, even the two transistors, $Q_2$ and $Q_3$, operate in the saturated region; the amplifier is capable of outputting enhanced power. The distributed transmission line $L_3$ may have the electrical length there of such that the outputs of the two transistors, $Q_2$ and $Q_3$, show a phase difference within $\pm\pi/4$, or further preferably $\pm\pi/8$, to enhance the output power without causing distortion. Moreover, the distributed transmission line $L_3$ may have the electrical length such that the output $v_2$ of the third transistor becomes that v4 of the third transistor $Q_3$ multiplied by 1.5 to 2.5, or further preferably 1.8 to 2.2.

The distributed transmission line $L_2$, which is inserted between the gate $G_2$ and the source $S_2$ of the second transistor $Q_2$, may simply adjust the phase difference between two outputs, v2 and v4, and the amplitude thereof. The second resistor $R_2$ may determine the gate bias, the voltage of the gate $G_2$ measured from the source $S_2$, by the DC current flowing therein. The other distributed transmission line $L_1$ between two nodes, $N_1$ and $N_3$, may also adjust the phase of the signals entering two transistors, $Q_2$ and $Q_3$. The distributed transmission line $L_0$ is for converting the impedance at the node N1 viewing the downstream stage into the impedance at the drain $D_1$ of the first transistor $Q_1$ also viewing the downstream stage, that is, the distributed transmission line $L_0$ converts the impedance at the drain $D_1$ of the first transistor $Q_1$ viewing the downstream stage into the output impedance of the first transistor $Q_1$.

The source $S_2$ of the second transistor $Q_2$ provides only the capacitor $C_2$ against the ground; that is no resistors are connected between the source $S_2$ and the ground. This arrangement may ground the source $S_2$ of the second transistor in the AC mode but float in the DC mode. Thus, the current re-use arrangement may be configured.

Second Embodiment

Figure 6:
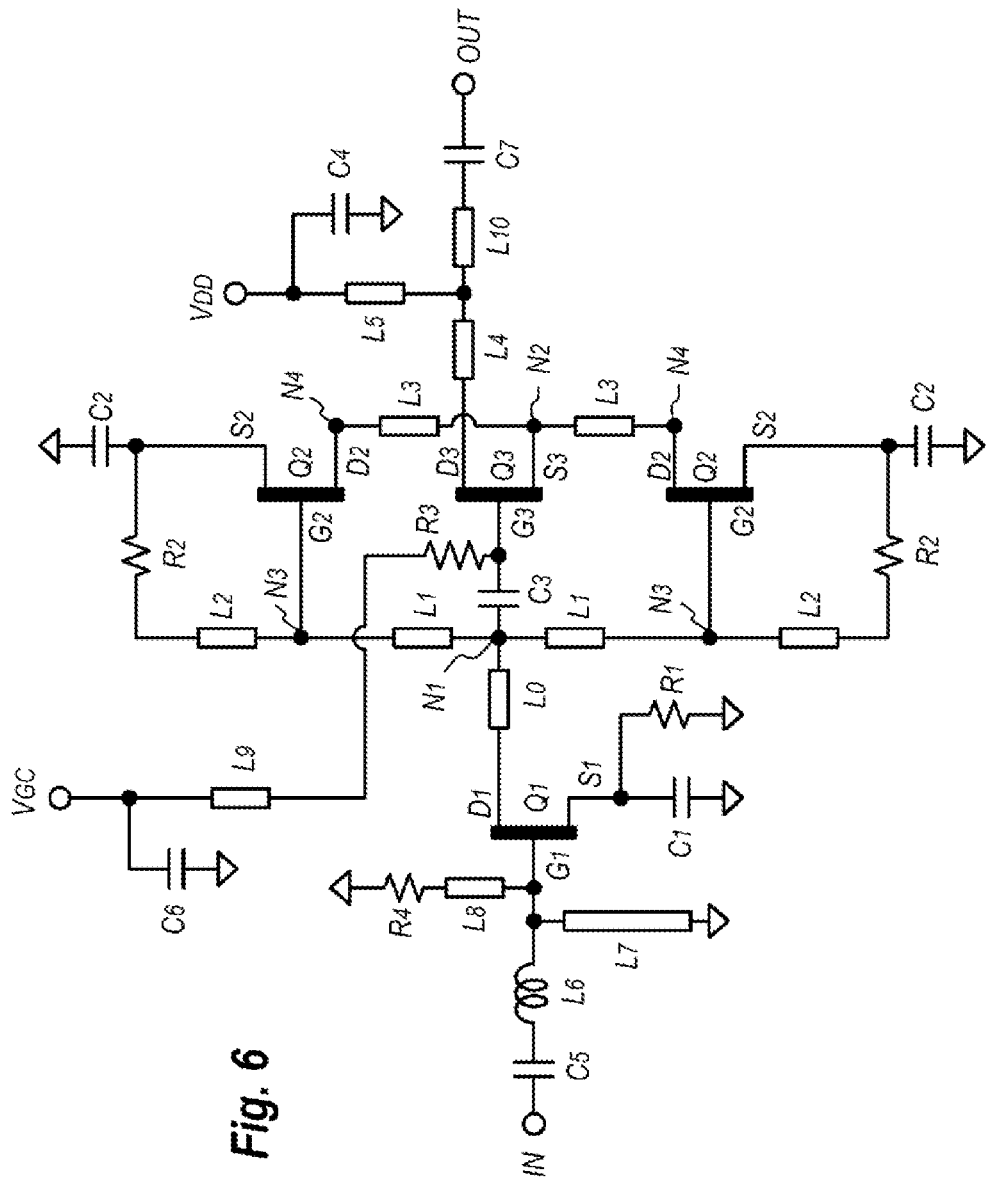
FIG. 6 is a circuit diagram of an amplifier according to the second embodiment of the invention.

FIG. 6 shows a circuit diagram of another current re-use amplifier according to the second embodiment of the present invention. The amplifier of the second embodiment has features, distinguishable from the amplifier of the first embodiment, in that (1) the amplifier of the second embodiment divides the second transistor $Q_2$ in the first embodiment into two parts symmetrically connected between the first and the second nodes, $N_1$ and $N_2$; (2) a series circuit of a capacitor $C_5$ and an inductor $L_6$ is inserted between the input terminal IN and the gate $G_1$ of the first transistor $Q_1$; and (3) another series circuit of a capacitor $C_7$ and a distributed transmission line $L_{10}$ is inserted between the output terminal OUT and the output of the amplifier of the first embodiment. The gate $G_1$ of the first transistor is grounded through a distributed transmission line $L_7$ and also a series circuit of a resistor $R_4$ and another distributed transmission line $L_8$. The capacitor $C_5$ may cut the DC component of the input signal, while, the inductor $L_6$, and two distributed transmission lines, $L_7$ and $L_8$, are for matching the input impedance of the amplifier.

The third transistor $Q_3$, similar to that of the first embodiment, in the gate $G_3$ thereof receives the amplified signal from the first node $N_1$ and biased by the bias supply $V_{GC}$ through a series circuit of the resistor $R_3$ and a distributed transmission line $L_9$, where the high frequency components contained in the amplified signal v1 and leaking through the resistor $R_3$ may be bypassed by a bypassing capacitor $C_6$ attributed to the bias supply $V_{GC}$. The capacitor $C_7$ in the output stage is for cutting the DC component contained in the output signal of the amplifier, while, the distributed transmission line $L_{10}$ is provided for matching the output impedance of the amplifier with load impedance. Although not explicitly illustrated in figures, the distributed transmission lines, $L_0$ to $L_{10}$, the capacitors, $C_1$ to $C_7$, the resistors, $R_1$ to $R_4$, and the inductors $L_6$ are formed on a semiconductor substrate common to all of those components; that is, the amplifier shown in FIG. 6 is formed as a microwave monolithic integrated circuit (MMIC).

Those components appearing in FIG. 6 have respective values of:

Distributed transmission liens, $L_0$ to $L_{10}$, have electrical lengths θ, physical lengths l, and physical widths w of, $θ_0$=0.5 radian, $θ_1$=0.2 radian, $θ_2$=4 θ, $θ_3$=3 θ, $l_4$=650 μm, $l_5$=700 μm, $l_7$=330 μm, $l_8$=200 μm, $l_9$=760 μm, $l_{10}$=450 μm, $w_4$=$w_5$=30 μm, $w_7$=$w_8$=$w_9$=$w_{10}$=10 μm, where radian corresponds to a wavelength λg of an RF signal subject to the amplifier, namely λg=2 π radian, which is assumed to be 20 GHz in the present embodiment, and θ is adjusted from 0 to 1.5 radian in the embodiment;

Inductor $L_6$ has a type of spiral inductor with 1.5 turns and a width of 20 μm within a total dimension of 120 μm²;

Capacitors, $C_1$ to $C_7$, have capacitance of $C_1$=13.5 pF, $C_2$=7.2 pF, $C_3$=0.36 pF, $C_4$=5.4 pF, $C_5$=0.54 pF, $C_5$=3.0 pF, and $C_7$=0.54 pF;

Resistors, $R_1$ to $R_4$, have resistance of $R_1$=$R_2$=2.5Ω, $R_3$=2.0 kΩ, and $R_4$=50Ω; Biases, $V_{DD}$ and $V_{GC}$ are $V_{DD}$=7.5 V and $V_{GC}$=3.6V, respectively, where the drain bias $V_{DD}$ flows out the current $I_{DD}$ of 50 mA; and Transistors, $Q_1$ to $Q_3$, have the type of high electron mobility transistor (HEMT) having a channel layer made of InGaAs, a barrier layer made of AlGaAs, and gate widths of 320 μm, 160 μm, and 320 μm, respectively. Performances of the amplifier of FIG. 6 are evaluated at frequencies of 18 to 22 GHz.

Figure 7:
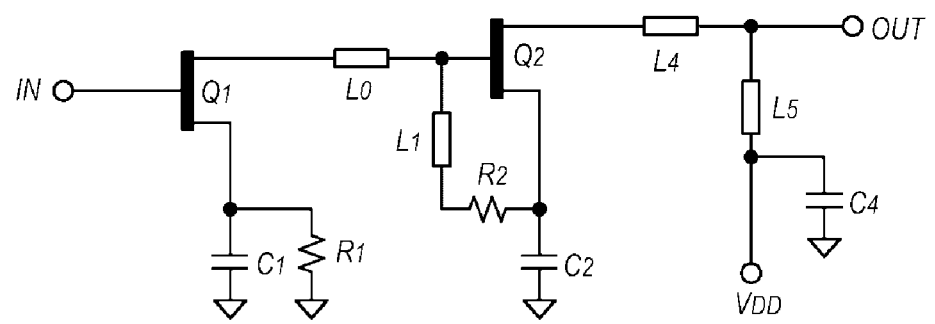
FIG. 7 is a circuit diagram of an amplifier according to the second example comparable to the amplifier of the second embodiment shown in FIG. 6.

The performances obtained by the amplifier shown in FIG. 6 is compared with those attained in a circuit shown in FIG. 7, where the amplifier in FIG. 7 is a type of also two stage amplifier involving two transistors, $Q_1$ and $Q_2$. The circuit elements shown in FIG. 7 have respective values of:

Distributed transmission lines, $L_0$ to $L_4$ have electrical lengths θ, physical lengths l, and physical widths w of $l_0$=$l_5$=400 μm, $l_1$=1000 μm, $l_4$=485 μm, $w_0$=$w_1$=$w_4$=$w_5$=20 μm;

Capacitors $C_1$ to $C_3$ have capacitance of $C_1$=13.5 pF, $C_2$=1.50 pF, $C_4$=13.8 pF;

Resistors $R_1$ and $R_2$ have resistance of $R_1$=0.65Ω and $R_2$=1.50 Ω;

Bias $V_{DD}$ of $V_{DD}$=5V for providing a current $I_{DD}$ of $I_{DD}$=50 mA; and Transistors, $Q_1$ and $Q_2$, also have the type of high electron mobility transistor (HEMT) having a channel layer made of InGaAs, a barrier layer made of AlGaAs, and gate widths of 320 μm and 320 μm, respectively. Performances of the amplifier of FIG. 6 are evaluated at frequencies of 18 to 22 GHz. The circuit shown in FIGS. 6 and 7 are formed as the MMIC with a dimension of 1.6×1.8 mm² common to each other.

Figure 8:
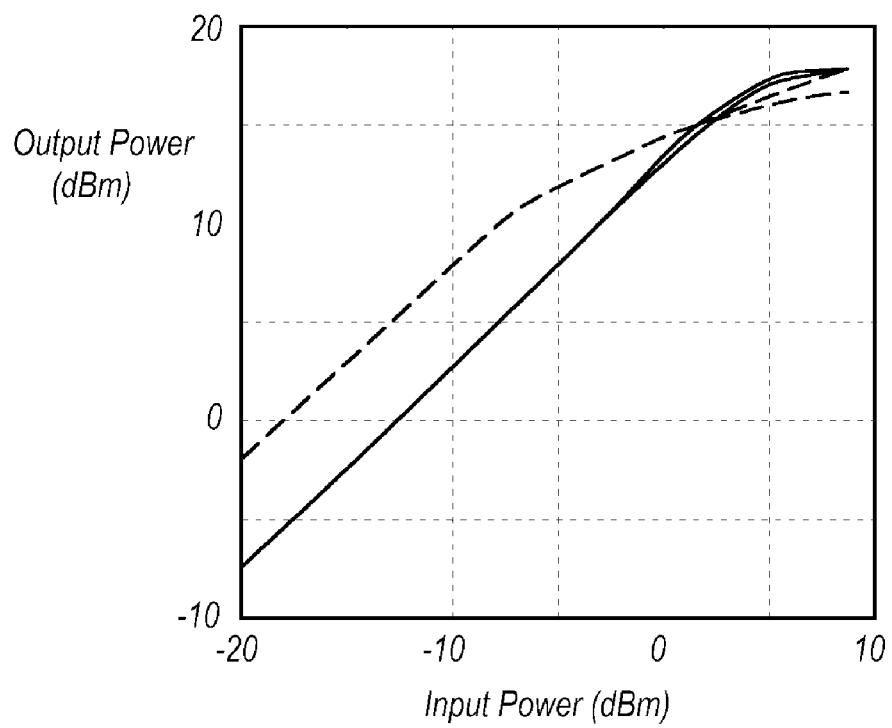
FIG. 8 compares saturation power of the amplifier shown in FIG. 6 according to the second embodiment of the invention with the amplifier shown in FIG. 7 according to the second comparable example.
Figure 9:
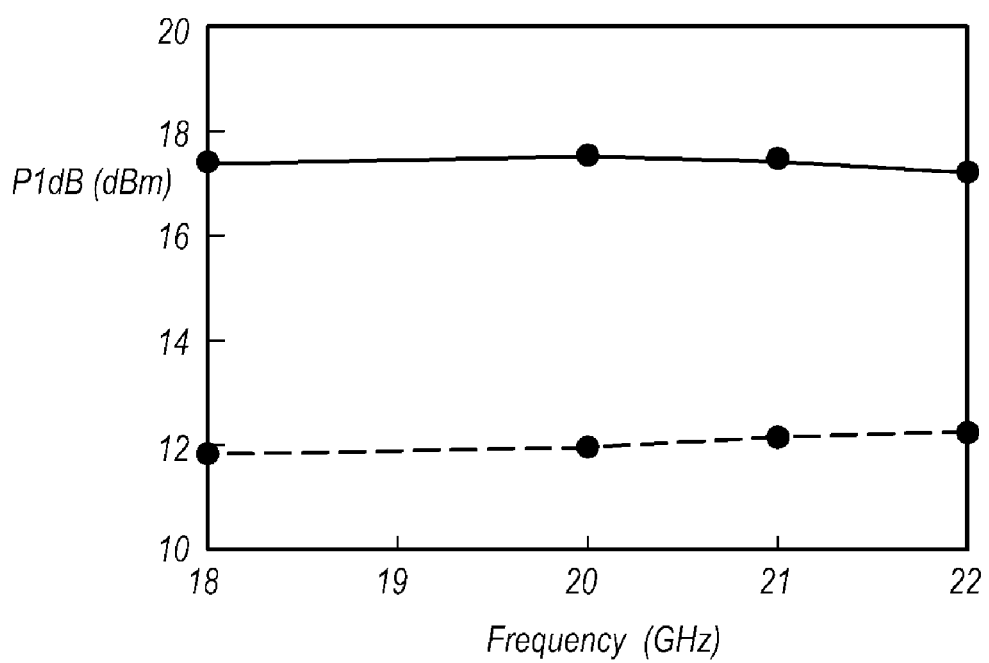
FIG. 9 compares P1 dB characteristics of the amplifier of the second embodiment shown in FIG. 6 with the amplifier of the second example shown in FIG. 7, where the P1 dB means the output power at which the gain of an amplifier decreases by 1 dB from the linear gain.

FIG. 8 compares saturation power of two amplifiers, where a solid line indicates the transfer characteristic of the amplifier of FIG. 6, while, a broken line shows the transfer characteristic of the amplifier of FIG. 7. The amplifier of FIG. 7 saturates the output power thereof at around 15 dBm, while, the amplifier of the second embodiment shown in FIG. 6 saturates the output power at about 18 dBm. FIG. 9 compares P1 dB characteristics of two amplifiers, where the P1 dB means the output power at which the gain of an amplifier decreases by 1 dB from the linear gain. The amplifier of the second embodiment shown in FIG. 6 exceeds the P1 dB of the amplifier of FIG. 7 by about 5 dB in a whole frequency range of 18 to 22 GHz. Thus, the amplifier of the second embodiment, even the die size thereof is substantially comparable to that of the comparable amplifier, may enhance the P1 dB more than 3 dB from the comparable amplifier, which is brought by two transistors, $Q_2$ and $Q_3$, whose outputs are efficiently combined.

Figure 10:
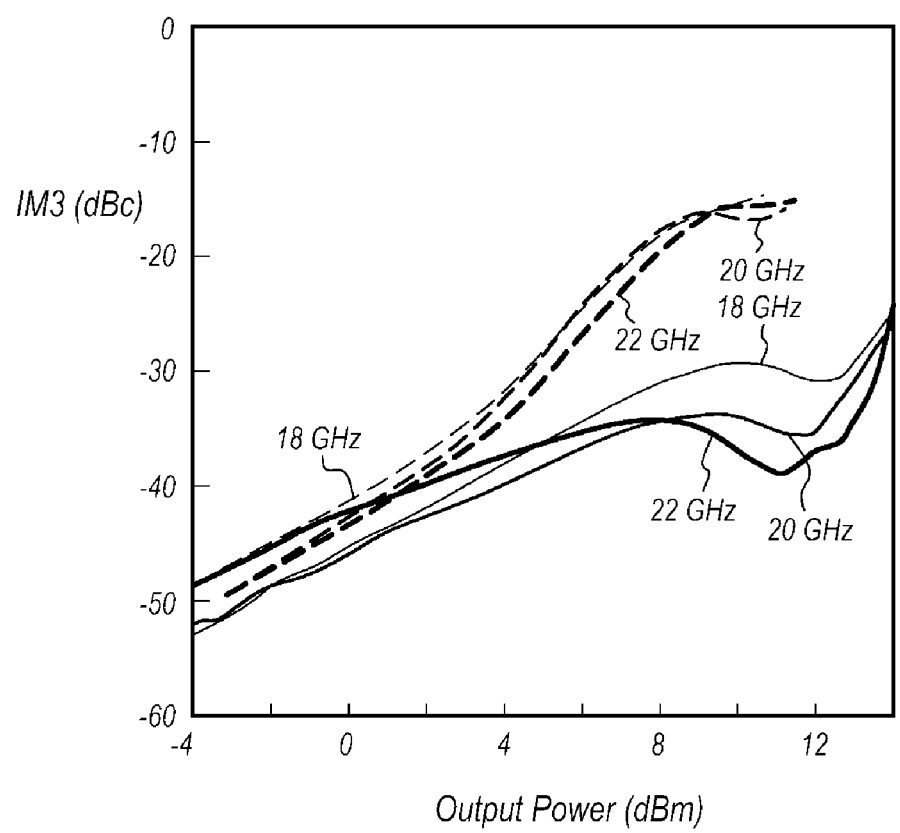
FIG. 10 compares IM3 performance of the amplifier of the second embodiment with that of the amplifier of the second comparable example, where the IM3 means the power of the third order components of the inter-modulation distortion against power of the carrier component.

FIG. 10 compares IM3 performance between two amplifiers, where the IM3 means power of the third order components of the inter-modulation distortion against power of the carrier component, namely, the power of the 0th order component when an amplifier receives two signals whose frequencies are set close enough, for instance, 10 MHz for the carrier frequency of 18 to 22 GHz. As shown in FIG. 10, the amplifier of the second embodiment may suppress the IM3 more than 15 dB compared with those attributed to the comparable amplifier of FIG. 7 for the output power of 8 to 9 dBm in frequencies from 18 to 22 GHz. Thus, the amplifier of the second embodiment shown in FIG. 6 may also enhance the distortion performance even in a range of large output power.

In the foregoing detailed description, the amplifier of the type of the current re-use configuration according to the present invention have been described with reference to specific exemplary embodiments thereof. It will, however, be evident that various modifications and changes may be made thereto without departing from the broader spirit and scope of the present invention. For instance, the embodiments concentrate on the transistors, $Q_1$ to $Q_3$, of the type of the FET. However, the amplifiers may implement transistors of the type of bipolar transistor as replacing the gate, the source, and the drain to the base, the emitter and the collector of a bipolar transistor, and the dimensions of the FET is replaceable to the emitter size of the bipolar transistor. Also, the distributed transmission lines may be replaced to, for instance, inductors, micro-strip lines, coplanar lines, and so on. The signal subject to the amplifier may have a frequency from 1 to 100 GHz. The present specification and figures are accordingly to be regarded as illustrative rather than restrictive.

The present application claims the benefit of priority of Japanese Patent Application No. 2016-069460, filed on Mar. 30, 2016, which is incorporated herein by reference.

We claim:

1. An amplifier that includes an upstream stage, a downstream stage and an intermediate node between the upstream stage and the downstream stage, the amplifier comprising:
a first transistor in the upstream stage, the first transistor including a control terminal and two current terminals, the control terminal receiving an input signal, one of the two current terminals being coupled to a ground and another of the two current terminals being connected with the intermediate node;
a second transistor in the downstream stage, the second transistor including a control terminal and two current terminals, the control terminal of the second transistor being coupled with the intermediate node, one of the two current terminals of the second transistor being grounded in an AC mode but floated in a DC mode;
a third transistor in the downstream stage, the third transistor including a control terminal and two current terminals, the control terminal of the third transistor being coupled with the intermediate node, one of the two current terminals of the third transistor being coupled with another of the two current terminals of the second transistor and another of the two current terminals of the third transistor outputting an output signal; and
a distributed transmission line connected between the another of the two current terminals of the second transistor and the one of the two current terminals of the third transistor, the distributed transmission line having an electrical length that substantially matches a phase of a signal appearing in the another of the two current terminals of the third transistor and a signal appearing in the another of the two current terminals of the second transistor, and the electrical length of the distributed transmission line substantially setting an amplitude of the signal appearing in the another of the two current terminals of the third transistor to be an amplitude of the signal appearing in the another of the two current terminals of the second transistor multiplied with 1.5 to 2.5,
wherein the third transistor is connected in series in the DC mode but in parallel in the AC mode with respect to the second transistor.

2. The amplifier of claim 1,
wherein the distributed transmission line has the electrical length that sets the amplitude of the signal appearing in the another of the two current terminals of the third transistor to be substantially twice of the amplitude of the signal appearing in the another of the two current terminals of the second transistor.

3. The amplifier of claim 1,
wherein the distributed transmission line has the electrical length that matches the phase of the signal appearing in the another of the two current terminals of the second transistor with the phase of the signal appearing in the another of the two current terminals of the third transistor within a range of $\pm\pi/4$.

4. The amplifier of claim 3,
wherein the distributed transmission line has the electrical length that matches the phase of the signal appearing in the another of the two current terminals of the second transistor with the phase of the signal appearing in the another of the two current terminals of the third transistor within a range of $\pm\pi/8$.

5. The amplifier of claim 1,
wherein the third transistor in the control terminal thereof receives an amplified signal output from the intermediate node through a capacitor.

6. The amplifier of claim 1,
further including another distributed transmission line between the control terminal and the one of the two current terminals of the second transistor,
wherein the another distributed transmission line has an electrical length that substantially matches a phase of an signal appearing in the another of the two current terminals of the second transistor with a phase of an signal appearing in the another of the two current terminals of the third transistor, and sets an amplitude of the signal appearing in the another of the two current terminals of the third transistor substantially twice of an amplitude of the signal appearing in the another of the two current terminals of the second transistor.

7. The amplifier of claim 1,
further including a power supply,
wherein the first to third transistors are connected in series between the power supply and ground in the DC mode.

8. The amplifier of claim 7,
further including resistors connected between the one of the two current terminals of the first transistor and the ground, and between the one of the two current terminals of the second transistor and the control terminal of the second transistor, respectively,
wherein the resistors determine gate biases for the first transistor and the second transistor by providing a bias current coming from the power supply thereto.

9. The amplifier of claim 7,
wherein the first transistor, the second transistor, and the third transistor have a type of field effect transistors with gate widths equal to each other.

10. An amplifier of a type of a current re-use configuration, comprising:
an upstream stage amplifier that receives an input signal and outputs an amplified signal, the upstream stage being grounded in a direct current (DC) mode and an alternating current (AC) mode;
a downstream stage that receives the amplified signal and outputs an output signal, the downstream stage being grounded in the AC mode but floated in the DC mode; and
a power supply that provides a bias current directly to the downstream stage but indirectly to the upstream stage through the downstream stage,
wherein the downstream stage provides two low-side transistors and a high-side transistor that are connected in parallel to each other in an AC mode to commonly receive an amplified signal output from the upstream stage, the high-side transistor and the two low-side transistors being connected in series in a DC mode by sandwiching respective transmission lines therebetween, the two low-side transistors having sizes equal to each other but a half of a size of the high-side transistor, the high-side transistor outputting the output signal, and
wherein the upstream stage includes a transistor having a size equal to the size of the high-side transistor in the downstream stage.

11. The amplifier of claim 10,
wherein the low-side transistors and the high-side transistor in the downstream stage show voltage gains and phase delays substantially equal to each other for the amplified signal coming from the upstream stage.

12. The amplifier of claim 11,
wherein the low-side transistors and the high-side transistor in the downstream stage show the voltage gain and the phase delays substantially equal to each other in saturated operating regions.

13. An amplifier that includes an upstream stage, a downstream stage and an intermediate node between the upstream stage and the downstream stage, the amplifier comprising:
- a first transistor provided in the upstream stage, the first transistor including a control terminal and two current terminals, the control terminal receiving an input signal, one of the two current terminals being coupled to a ground and another of the two current terminals being connected with the intermediate node;
- a second transistor provided in the downstream stage, the second transistor including a control terminal and two current terminals, the control terminal of the second transistor being coupled with the intermediate node, one of the two current terminals of the second transistor being grounded in an AC mode but floated in a DC mode;
- a third transistor provided in the downstream stage, the third transistor including a control terminal and two current terminals, the control terminal of the third transistor being coupled with the intermediate node, one of the two current terminals of the third transistor being coupled with another of the two current terminals of the second transistor and another of the two current terminals of the third transistor outputting an output signal;
- a distributed transmission line connected between the another of the two current terminals of the second transistor and the one of the two current terminals of the third transistor; and
- another distributed transmission line connected between the control terminal of the second transistor and the one of the two current terminals of the second transistor, the another distributed transmission line having an electrical length that substantially matches a phase of a signal appearing in the another of the two current terminals of the second transistor with a phase of a signal appearing in the another of the two current terminals of the third transistor and setting an amplitude of the signal appearing in the another of the two current terminals of the third transistor substantially twice of an amplitude of the signal appearing in the another of the two current terminals of the second transistor, and
- wherein the third transistor is connected in series in the DC mode but in parallel in the AC mode with respect to the second transistor.

* * * * *